United States Patent
Brida

(10) Patent No.: US 9,470,592 B2
(45) Date of Patent: Oct. 18, 2016

(54) MICROMECHANICAL STRUCTURE HAVING A DEFORMABLE MEMBRANE AND A PROTECTION AGAINST STRONG DEFORMATIONS

(71) Applicant: AUXITROL S.A., Bourges (FR)

(72) Inventor: Sebastiano Brida, Salles Sur L'Hers (FR)

(73) Assignee: AUXITROL S.A., Bourges (FR)

( * ) Notice: Subject to any disclaimer, the term of this patent is extended or adjusted under 35 U.S.C. 154(b) by 219 days.

(21) Appl. No.: 14/354,113

(22) PCT Filed: Oct. 24, 2012

(86) PCT No.: PCT/EP2012/071000
§ 371 (c)(1),
(2) Date: Apr. 24, 2014

(87) PCT Pub. No.: WO2013/060697
PCT Pub. Date: May 2, 2013

(65) Prior Publication Data
US 2014/0290375 A1    Oct. 2, 2014

(30) Foreign Application Priority Data
Oct. 26, 2011  (FR) ..................... 11 59726

(51) Int. Cl.
*G01L 9/00* (2006.01)
*G01L 19/06* (2006.01)
*B81B 3/00* (2006.01)

(52) U.S. Cl.
CPC ........... *G01L 9/0047* (2013.01); *B81B 3/0051* (2013.01); *B81B 3/0097* (2013.01); *G01L 9/0042* (2013.01); *G01L 9/0048* (2013.01); *G01L 19/0618* (2013.01); *B81B 2201/0264* (2013.01)

(58) Field of Classification Search
None
See application file for complete search history.

(56) References Cited

U.S. PATENT DOCUMENTS

| 5,062,302 A | 11/1991 | Petersen et al. |
| 2013/0087864 A1* | 4/2013 | Ten Have ........... B81C 1/00158 257/419 |
| 2015/0033878 A1* | 2/2015 | Brida .................... G01L 9/0045 73/862.637 |

FOREIGN PATENT DOCUMENTS

FR    2 859 281    3/2005

*Primary Examiner* — Andre Allen
(74) *Attorney, Agent, or Firm* — Blakely Sokoloff Taylor & Zafman LLP

(57) ABSTRACT

The invention relates to a micromechanical structure for measuring or detecting a mechanical quantity or a dynamic quantity, including a deformable membrane (20) and a supporting substrate (10), the membrane (20) including a first portion (20a) and a second portion (20b) surrounded by the first portion (20a), the second portion (20b) having a thickness that is less than the thickness of the first portion (20a), the membrane (20) being suspended above the supporting substrate (10) and thus defining a free space (30), said micromechanical structure comprising in addition a lower abutment (21) for limiting the deformations of the membrane (20), said lower abutment (21) being arranged above the supporting substrate (10) and extending into the free space (30) from said supporting substrate (10) toward the membrane (20), characterized in that the lower abutment (21) comprises islets (101-108) that extend into the free space (30) toward the membrane (20) from a flat surface of the lower abutment (21), the islets (101-108) forming a relief structure in such a manner that, in the case of contact between the islets (101-108) and the fine portion (20b) of the membrane (20), the contact surface between the islets (101-108) and the fine portion (20b) of the membrane (20) is small with respect to the dimensions of the fine portion (20b) of the membrane (20).

15 Claims, 4 Drawing Sheets

MICROMECHANICAL STRUCTURE HAVING A DEFORMABLE MEMBRANE AND A PROTECTION AGAINST STRONG DEFORMATIONS

GENERAL TECHNICAL FIELD

The invention relates to a micromechanical structure intended to measure or detect a mechanical magnitude or a dynamic magnitude.

And it relates more particularly to a micromechanical structure for absolute, relative or differential measuring of a pressure.

STATE OF THE ART

A micromechanical structure for measuring a mechanical or dynamic magnitude such as pressure conventionally includes a deformable membrane and a support substrate, the membrane being suspended above the support substrate and defining a free space.

Uses of these suspended membranes are known.

Capacitive sensors or strain gauges supported by the membrane can measure the deformations undergone by the membrane subject to a contribution of external energy (such as for example pressure applied perpendicularly to the principal plane of the membrane), in observing the modifications of physical properties of the membrane associated to deformations (such as for example a change in electric capacity or internal stresses).

Modifications in energy made to the membrane or force exerted on the membrane can be measured for example in this way and therefore physical magnitudes in a certain medium can be monitored (these are magnitudes of dynamic type, that is, of acceleration type or deceleration type, and/or mechanical type).

Such membranes subjected to strong energies can become fragile, their intrinsic properties can be altered, and their structure can crack or even break.

PRESENTATION OF THE INVENTION

The invention overcomes at least one of the above disadvantages.

To this end the invention proposes a micromechanical structure for measuring or detecting a mechanical magnitude or a dynamic magnitude, including a deformable membrane and a support substrate, the membrane including a first part and a second part enclosed by the first part, the second part having a thickness less than the thickness of the first part, the membrane being suspended above the support substrate defining a free space, said micromechanical structure also including a lower abutment adapted to limit deformations of the membrane, said lower abutment being arranged above the support substrate and extending in the free space from said support substrate towards the membrane, characterized in that the lower abutment includes islets extending into the free space towards the membrane from a flat surface of the lower abutment, the islets forming a relief structure such that in case of contact between the islets and the fine part of the membrane, the contact surface between the islets and the fine part of the membrane is slight relative to the dimensions of the fine part of the membrane.

The invention is advantageously completed by the following characteristics, taken alone or in any technically possible combination:

- the islets include inclined facets which are oriented according to acute angles greater than zero degrees relative to the flat surface of the lower abutment;
- the islets are in the form of a mesa;
- the support substrate also have a central traversing recess;
- the lower abutment includes a central traversing recess in the form of a cone;
- it also includes an upper abutment arranged above the membrane;
- the upper abutment includes recesses distributed around its centre;
- the support base and the lower abutment are respectively formed from two materials different to each other;
- the support substrate is made of glass and in which the lower abutment and said support substrate made of glass are connected by anodic sealing or by means of a molecular or covalent bond with or without intermediate layer, or by sintering or by brazing;
- the support base and the lower abutment are formed from one and the same material;
- the support base and the abutments are each made of material selected from the following materials: alloys; glass; quartz; alumina; ceramic; Si; SiC; sapphire;
- the fine part of the membrane has a thickness of between 20 µm and 100 µm;
- the islets have a height of between 10 µm and 50 µm and a maximal width of between 20 µm and 200 µm.

In addition, the invention proposes a differential pressure sensor including a micromechanical structure according to the initial aspect of the invention.

The invention has many advantages.

The lower abutment protects the membrane from overpressure.

The fact of providing an abutment as an independent element for resistance to overpressure adds the latter to all existing micromechanical structures, without any dimensional change to the deformable membrane and without any modification of the mechanical or thermal behaviour of the structure.

In this way, the resistance of the micromechanical structure is increased without modifying either the structure or the geometry of the suspended membrane. Also, it modifies neither the structure nor the definition of the measuring elements mounted on the membrane and does not encumber the exposed part of the membrane.

Also, the islets minimise stresses due to thermal dilation of oil or another fluid (liquid or gaseous) present in the space between the membrane and the abutment. These islets also allow good circulation of fluid and improve filling of the structure in the case of use as a differential pressure sensor. This is very important in the case of viscous fluid, the islets avoiding the appearance of air bubbles in the fluid, and reducing errors which might be due to poor circulation of fluid, once the structure is filled with said fluid, in the case of use as a differential pressure sensor for example.

The micromechanical structure therefore attains resistance to external stresses without the need to modify the suspended membrane, this micromechanical structure capable of functioning with standard membranes, for example.

PRESENTATION OF FIGURES

Other characteristics and advantages of the invention will emerge from the following description which is purely illustrative and non-limiting and must be considered with respect to the attached drawings, in which.

DETAILED DESCRIPTION OF THE INVENTION

Figure 1:
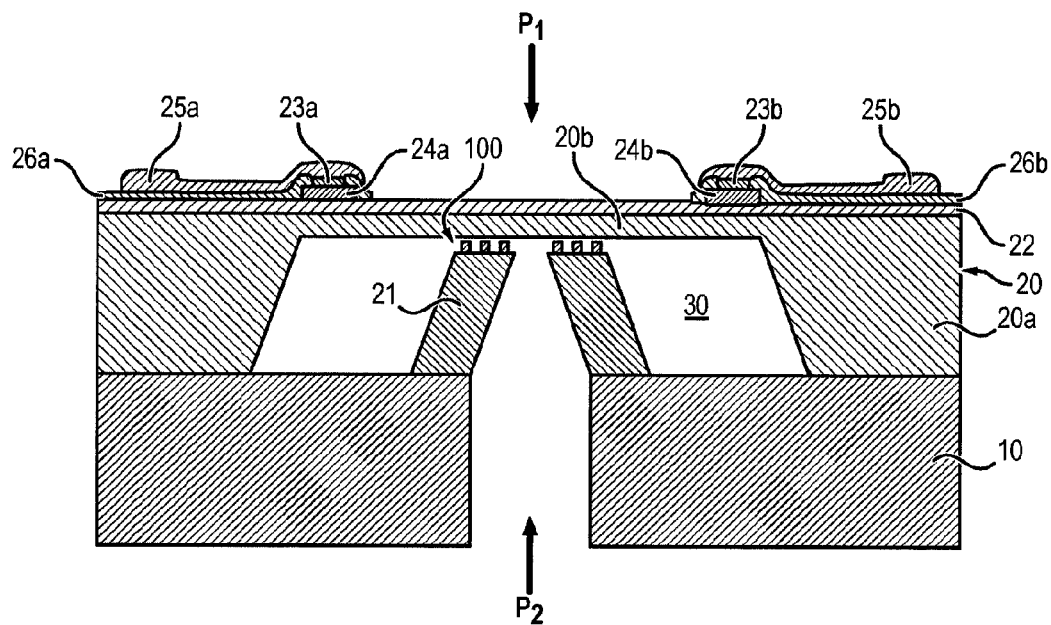
FIG. 1 illustrates a micromechanical structure according to an embodiment of the invention.

In all figures, similar elements bear identical reference numerals.

A micromechanical structure intended to measure or detect a mechanical magnitude or a dynamic magnitude such as pressure includes a deformable membrane 20 and a support substrate 10.

Figure 2:
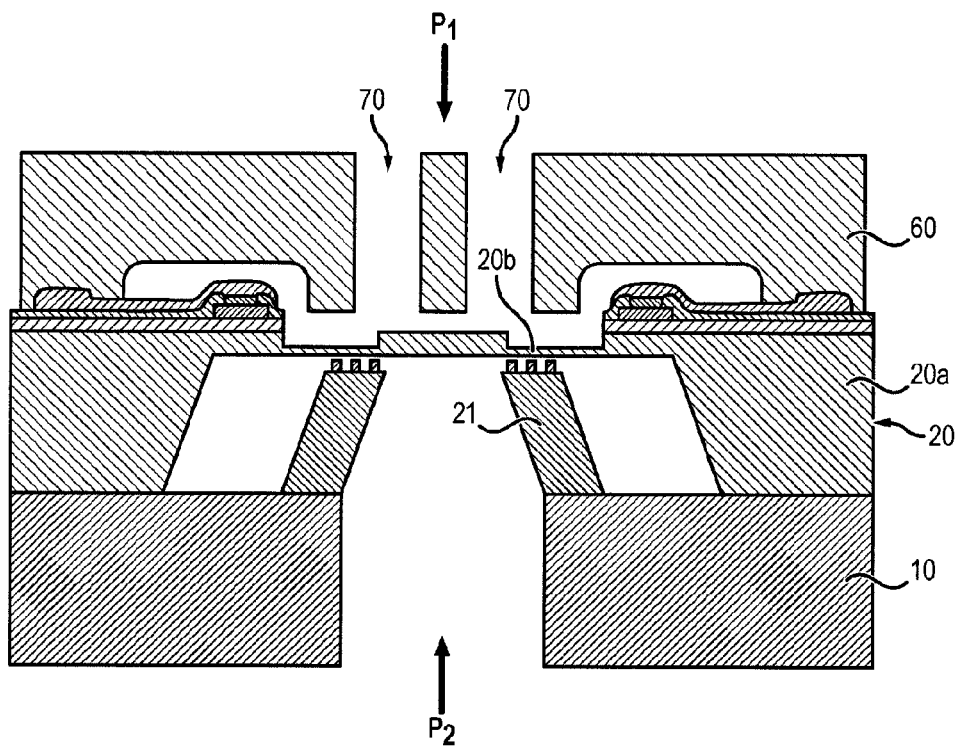
FIG. 2 illustrates a micromechanical structure according to an embodiment of the invention.
Figure 3:
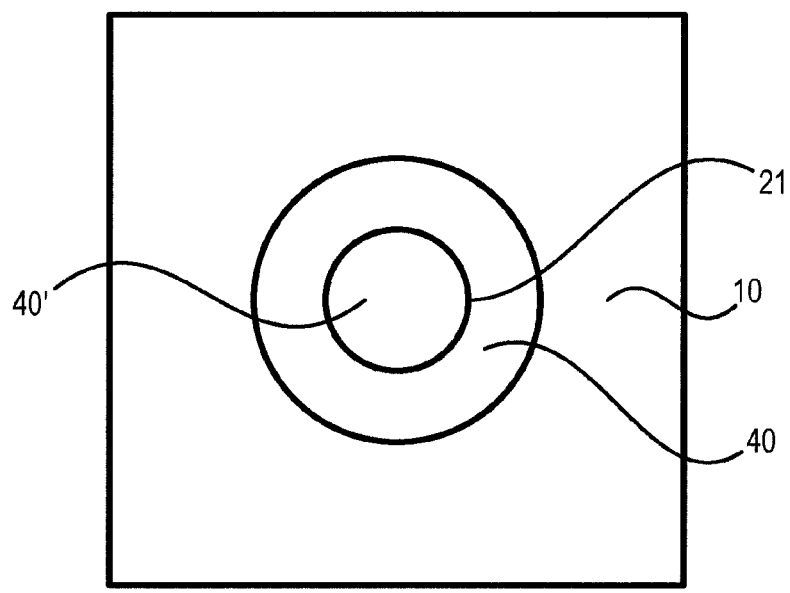
FIG. 3 illustrates a bottom plan view of the micromechanical structure of the invention.
Figure 4:
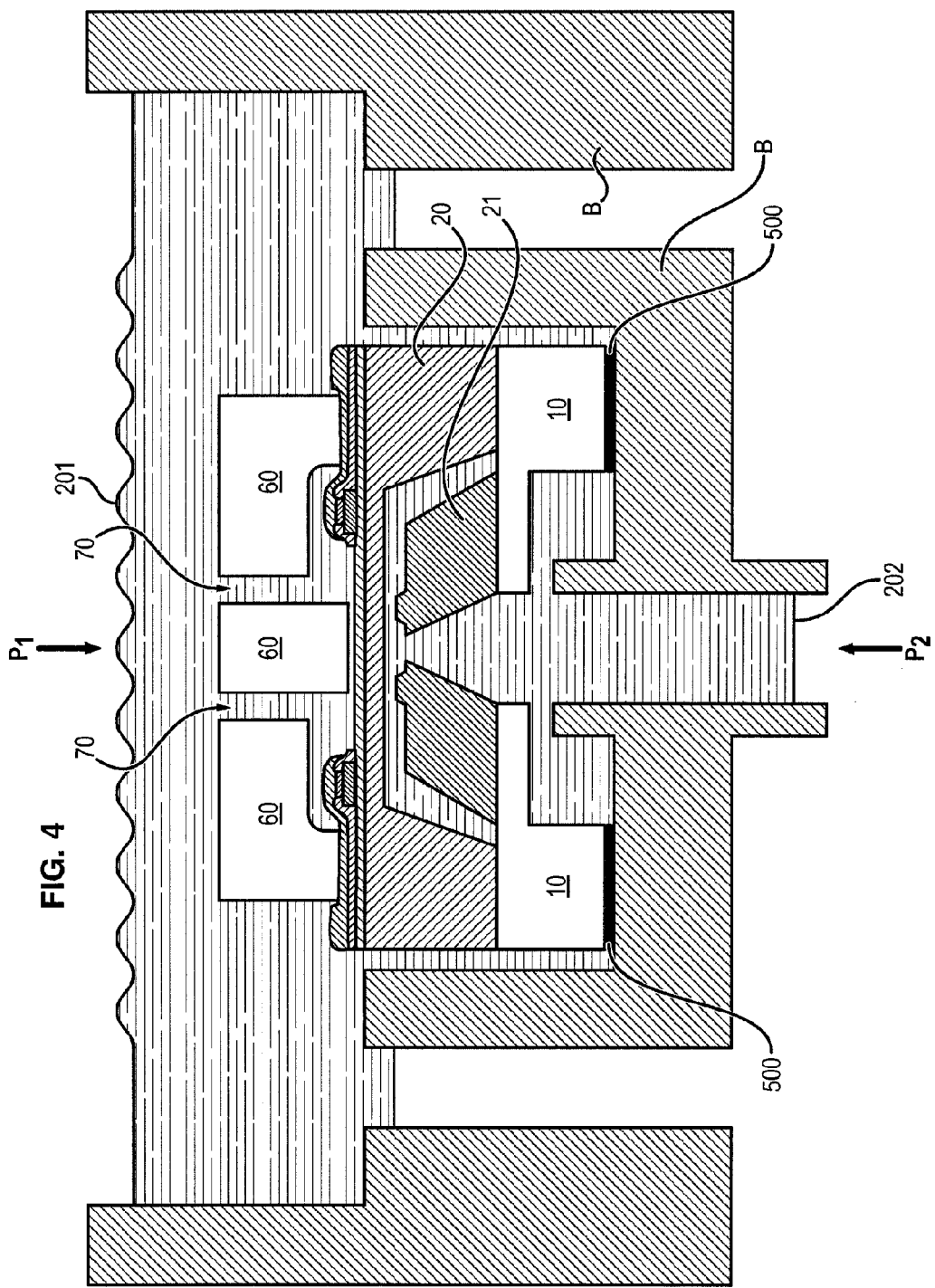
FIG. 4 illustrates a pressure differential sensor including a micromechanical structure according to the invention.

As is evident in FIGS. 1, 2 and 4, the membrane is arranged above the support substrate 10 to define a free space 30. This free space 30 is intended to be filled by fluid in the case of a micromechanical structure for differential measuring of pressure. In this case, pressure P1 comes from above the structure and pressure P2 comes from below the structure (see FIGS. 1, 2 and 4).

The membrane 20 is intended to support pressure-measurement elements 22, 23a, 23b, 24a, 24b, 25a, 25b, 26a, 26b.

The free space 30 is generally formed by micro-machining in an initial substrate. The techniques of micro-machining to form such a free space can for example be chemical etching such as KOH etching at a determined temperature.

Similarly, the membrane is constituted by two distinct parts: a first part 20a which has a thickness greater than a second part 20b fine which serves as active element. The second part 20b is enclosed by the first part 20a. The part 20a is that in contact with the support substrate 10, whereas the fine part 20b is suspended above the free space 30.

The second part 20b of the membrane 20 has a thickness less than the thickness of the first part 20a of the membrane.

The thickness of the part 20b fine is typically of between 20 and 100 m, the value being defined according to the range of the mechanical or dynamic magnitude to be measured.

In this way, the membrane 20, especially its fine part 20b, can deform under the effect of pressure P1 applied to the latter.

The support substrate 10 can be made of material based on glass, silicon quartz, Pyrex(™), sapphire, alumina, Si, SiC.

The thickness of the support substrate 10 is typically between 500 μm and 2000 μm.

The membrane 20 is connected to the support substrate 10 by anodic sealing or by means of a molecular or atomic bond with or without intermediate layer, or by sintering or by brazing.

The membrane 20 is typically formed from a substrate for example including monocrystalline silicon such as SOI "Silicon On Insulator") and PSOI "Poly Silicon On Insulator", sapphire such as SOS "Silicon On Sapphire", or another material such as SiCOI "SiC on Insulator" or SiC.

The membrane 20 includes an electrically insulating layer 22 such as a $SiO_2$ layer in the case of a membrane 20 made of SOI or PSOI, deposited on its external surface opposite the free space 30. Different materials such as nitrides, oxides, metal layers, mono- and polycrystalline silicon are placed onto this insulating layer 22 so as to form the microstructures 23a, 23b, 24a, 24b, 25a, 25b, 26a, 26b. The micro-structures can form strain gauges and serve as elements for measuring the physical magnitude for measuring pressure, for example.

To ensure connections, electric contact zones 25a, 25b are also arranged on the membrane 20. These electric contact zones 25a, 25b include aluminum, gold, platinum, titanium and tungsten, for example.

To protect the membrane 20 from deformation, in case of overpressure coming from the top of the structure, the micromechanical structure includes a lower abutment 21 limiting deformation of the membrane 20. The lower abutment 21 is arranged above the support substrate 10 and extends into the free space 30 from the support substrate 10 towards the membrane 20.

The lower abutment 21 preferably includes material identical to that of the membrane 20 or made of alloys, sapphire, alumina, ceramic, quartz or glass. It can also include material identical to that of the support substrate 10.

The lower abutment 21 has a general trapezoid shape, the large base being arranged on the substrate 10 support and the small base arranged directly below the membrane 20 in particular under its fine part 20b, this small base defining a flat surface of the lower abutment 21.

Figure 5:
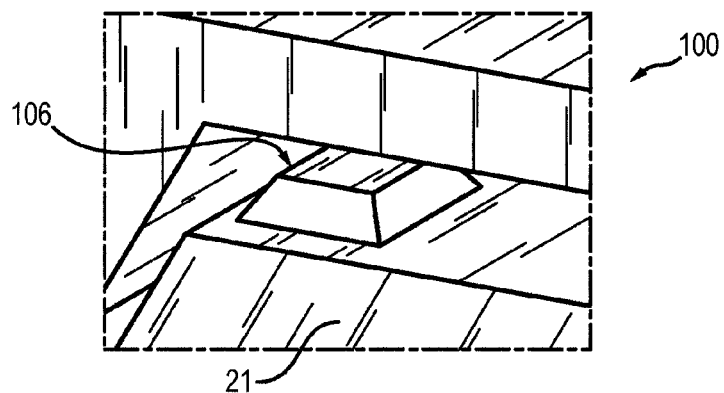
FIG. 5 illustrates a detailed view of part of the micromechanical structure of the invention.
Figure 6A:
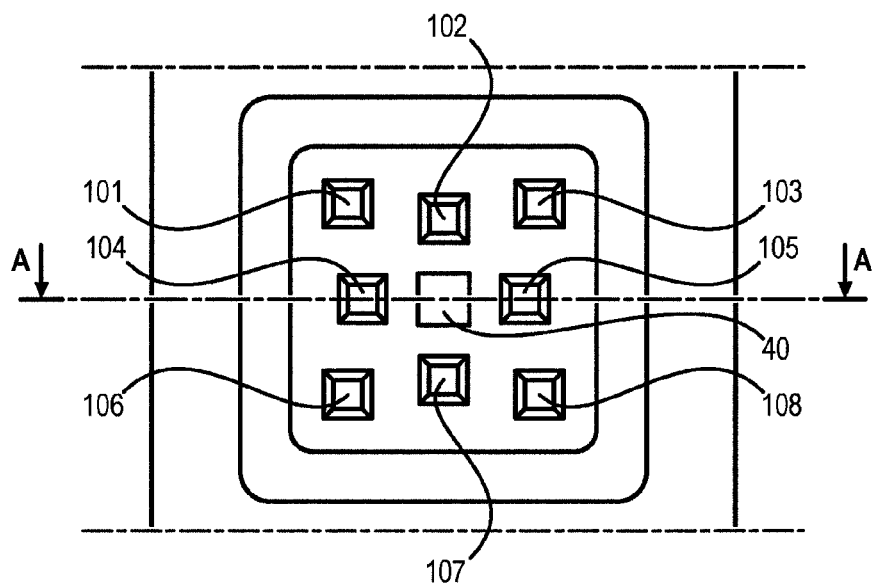
FIGS. 6a and 6b illustrate two views of the lower abutment of the micromechanical structure of the invention.
Figure 6B:
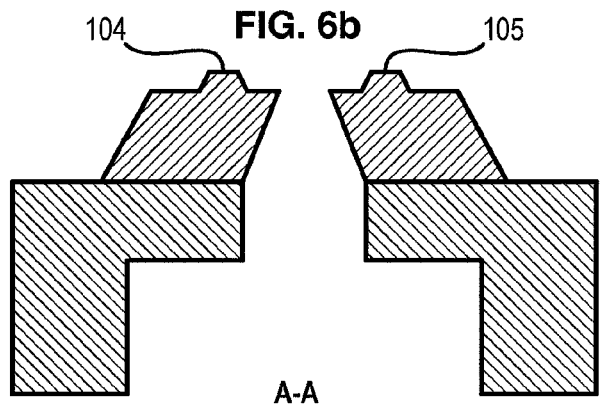

To boost the efficacy of the lower abutment 21 the latter includes (see FIGS. 5 and 6a and 6b), on a flat surface, defined especially by the small base of the lower abutment, islets 101, 102, 103, 104, 105, 106, 107, 108 which extend from a flat surface of the lower abutment 21, the flat surface corresponding to the base of the islets.

The islets 101-108 form a relief structure such that in case of contact between the islets 101-108 and the fine part 20b of the membrane 20, the contact surface between the islets 101-108 and the fine part 20b of the membrane 20 is slight relative to the dimensions of the fine part 20b of the membrane 20.

The islets 101-108 advantageously include inclined facets which are oriented according to acute angles greater than zero degrees relative to the flat surface of the lower abutment. They are especially in the form of a mesa.

The resulting islets enable optimal circulation of fluid in the space between the membrane 20 and the lower abutment 21.

Another advantage is that the islets also minimise errors due to the variation in density of fluid (in case of variation in temperatures during use of the micromechanical structure, for example from −50° C. to 180° C.) in the space located between the lower abutment 21 and the membrane 20.

The islets have a height of preferably between 10 μm and 50 μm, and a width at the base of between 20 μm and 200 μm.

Also, the islets are dimensioned so that the fine part of the membrane and the islets are spaced by a distance of between 5 and 30 μm, preferably 10 μm.

The islets are for example obtained by a micro-machining process including steps of photolithography and etching applied to the upper face of the lower abutment 21. The type of etching applied defines the form of the islets (mesa form for humid anisotropic etching of KOH etching type, TMAH form with vertical walls for dry etching of type RIE "Reactive Ion Etching").

Preferably, the lower abutment including the islets is obtained from a substrate made of silicon in which the islets and the recess (see below) are formed by etching. The pre-formation zones of the islets are protected by a mask preferably made of $SiO_2+Si_3N_4$, a second mask $SiO_2+Si_3N_4$ being made after the bond of the lower abutment 21 to the support substrate 10, the bond being preferably made by anodic sealing, the support substrate 10 being made of glass.

As mentioned hereinabove, there is a distance between the lower abutment 21 and the membrane 20. This distance represents the maximal deformation distance of the membrane 20. In this way, greater deformation than this distance supports the membrane 20 against the abutment 21, which prevents overdeformation linked to overpressure. This is in particular against the islets which the membrane 20 supports in the case of overpressure P1 coming from the top of the structure.

By way of advantage, the value of this distance can be selected as a function of the parameters of resistance to deformation of the membrane 20 (dependent especially on its thickness and the material including it) with a threshold distance from which the membrane risks deteriorating.

This is how it is possible to adjust the parameters of the lower abutment 21 as a function of the planned application.

For differential measuring of pressure, the support substrate 10 therefore includes a traversing recess 40 which extends according to a recess 40' in the lower abutment 21. The recesses 40, 40' of the support substrate 10 and of the lower abutment 21 are preferably circular.

The recess 40' of the abutment can be of a diameter identical to or less than the diameter of the recess of the support substrate 10. However a recess is preferred in the form of a cone such as the large diameter of the cone or of the side of the support substrate 10 and reduces while the recess progresses in thickness from the lower abutment 21.

It is noted that without recess 40, the micromechanical structure enables absolute measuring of pressure.

The recess 40 has a geometric form for access of pressure via the support substrate 10. The recess 40 can take the form of a simple cylinder of a diameter generally between 500 µm and 1500 µm, or a more complex form such as for example a double cylinder the diameter of the upper part of which will be less than that of the simple cylinder.

The recesses 40, 40' of the support substrate 10 and of the lower abutment 21 allow passage of fluids (gas or liquids) and are therefore necessary in the case of a differential or relative sensor to allow transfer of the pressure P2 to the lower part of the membrane 20.

The recesses 40, 40' in the support substrate 10 of the lower abutment 21 are made by etching by means of an alkaline solution for anisotropic etching (KOH, TMAH, . . . ), preferably conducted in two steps: a first pre-etching step, then final etching after the bond of the lower abutment 21 on the support substrate 10, the bond preferably being made by anodic sealing, the support substrate 10 being made of glass. It is noted that the zones to be spared by etching are protected by a 3D photolithography process of known type based on thick resin (thickness of between 10 µm and 50 µm).

To improve the resistance of the micromechanical structure for differential measuring of the pressure, the latter also includes an upper abutment 60 arranged above the membrane 20 (see FIGS. 2 and 4).

The function of the upper abutment 60 is to mechanically protect the membrane 20 in the event where overpressure comes from below the structure (pressure P2 in FIGS. 2 and 4).

The upper abutment 60 also has one or more recesses 70 (typically four) at its centre and is connected to the rest of the structure via anodic sealing or by means of a molecular or covalent bond with or without intermediate layer, or by sintering or by brazing.

The recesses 70 are pierced in the upper abutment 60 to reduce the effects of capillarity and dilation in temperature after filling by fluid, as well as to make for easier transmission of the pressure P1. Recesses are made at the four corners of the upper abutment 60 to enable the connection to a mechanical housing.

In fact, as illustrated in FIG. 4, the structure described hereinabove is intended to be placed in a housing B and will be immersed in fluid (hatched zones in FIG. 4).

The upper abutment 60 is preferably obtained from a substrate of pierced borosilicate glass.

The upper abutment 60 has overetching zones at the level of the metal tracks and at the four corners of the upper abutment to allow the electrical connection and to make filling by fluid easier. Also, as previously, the zones spared by overetching are protected by a 3D photolithography process of known type based on thick resin.

The invention claimed is:

1. A micromechanical structure intended to measure or detect a mechanical magnitude or a dynamic magnitude, including a deformable membrane (20) and a support substrate (10), the membrane (20) including a first part (20a) and a second part (20b) enclosed by the first part (20a), the second part (20b) having a thickness less than the thickness of the first part (20a), the membrane (20) being suspended above the support substrate (10) and thus defining a free space (30), said micromechanical structure also including a lower abutment (21) adapted to limit the deformations of the membrane (20), said lower abutment (21) being arranged above the support substrate (10) and extending in the free space (30) from said support substrate (10) towards the membrane (20), characterized in that the lower abutment (21) includes islets (101-108) which extend into the free space (30) towards the membrane (20) from a flat surface of the lower abutment (21), the islets (101-108) forming a relief structure such that in the event of contact between the islets (101-108) and the second part (20b) of the membrane (20), the contact surface between the islets (101-108) and the second part (20b) of the membrane (20) is small relative to the dimensions of the second part (20b) of the membrane (20).

2. The micromechanical structure according to claim 1, wherein the islets (101-108) include inclined facets which are oriented according to acute angles greater than zero degrees relative to the flat surface of the lower abutment (21).

3. The micromechanical structure according to any one of claims 1 to 2, wherein the islets are in the form of a mesa.

4. The micromechanical structure according claim 1, wherein the second part (20b) of the membrane (20) has a thickness of between 20 µm and 100 µm.

5. The micromechanical structure according to claim 1, wherein the islets are dimensioned such that the second part of the membrane and the islets are spaced by a distance of between 5 and 30 µm, preferably 10 µm.

6. The micromechanical structure according to claim 1, wherein the islets (101-108) have a height of between 10 µm and 50 µm and a maximal width, at the base, of between 20 µm and 200 µm.

7. The micromechanical structure according to claim 1, wherein the support substrate (10) also has a central traversing recess (40).

8. The micromechanical structure according to claim 1, wherein the lower abutment (21) includes a central traversing recess (40') in the form of a cone.

9. The micromechanical structure according to claim 1, also including an upper abutment (60) arranged above the membrane.

10. The micromechanical structure according to claim 9, wherein the upper abutment (60) includes recesses distributed around its centre.

11. The micromechanical structure according to claim 1, wherein the support base (10) and the lower abutment (21) are formed in different materials.

12. The micromechanical structure according to claim 11, wherein the support substrate is made of glass and wherein the abutment and said support substrate made of glass are connected by anodic sealing or by means of a molecular or covalent bond with or without intermediate layer, or by sintering or by brazing.

13. The micromechanical structure according to claim 1, wherein the support base and the lower abutment (21) are formed from one and the same material.

14. The micromechanical structure according to claim 1, characterized in that the support base and the abutment are each made of material selected from the following materials: glass; quartz; alumina; ceramic; alloys; Si; SiC; sapphire.

15. A differential pressure sensor including a micromechanical structure according to claim 1.

* * * * *